United States Patent [19]

Rao

[11] 4,207,585
[45] Jun. 10, 1980

[54] SILICON GATE MOS ROM

[75] Inventor: G. R. Mohan Rao, Houston, Tex.

[73] Assignee: Texas Instruments Incorporated, Dallas, Tex.

[21] Appl. No.: 841,502

[22] Filed: Oct. 11, 1977

Related U.S. Application Data

[63] Continuation-in-part of Ser. No. 701,932, Jul. 1, 1976, abandoned.

[51] Int. Cl.² .............................................. H01L 27/04
[52] U.S. Cl. .......................................... 357/41; 29/571;
29/580; 29/578; 357/23; 357/45; 357/59;
365/104
[58] Field of Search ..................... 357/23, 41, 45, 91,
357/59; 29/571, 578, 580; 365/104

[56] References Cited

U.S. PATENT DOCUMENTS

| | | | |
|---|---|---|---|
| 3,676,921 | 7/1972 | Kooi | 357/23 |
| 3,711,753 | 1/1973 | Brand et al. | 357/59 |
| 3,914,855 | 10/1975 | Cheney et al. | 357/91 |

OTHER PUBLICATIONS

Antipov, IBM Tech. Discl. Bull., vol. 17, No. 1, pp. 102-103, Jun. 1974.
Richman, MOS Field Effect Transistors and Integrated Circuits, (Wiley, N.Y., 1973), pp. 200-212.

Primary Examiner—William D. Larkins
Attorney, Agent, or Firm—John G. Graham

[57] ABSTRACT

An N-channel silicon gate MOS read only memory or ROM formed by a process compatible with standard N-channel manufacturing methods but which allows the elimination of contacts between overlying metal or polysilicon lines and the semiconductor surface. Address lines are polysilicon, and output and ground lines are defined by N+ regions buried beneath field oxide. In the array, for each potential MOS transistor, a logic "1" or "0" is programmed by providing a thin oxide gate region beneath a polysilicon address line for one and providing thick field oxide for the other.

7 Claims, 9 Drawing Figures

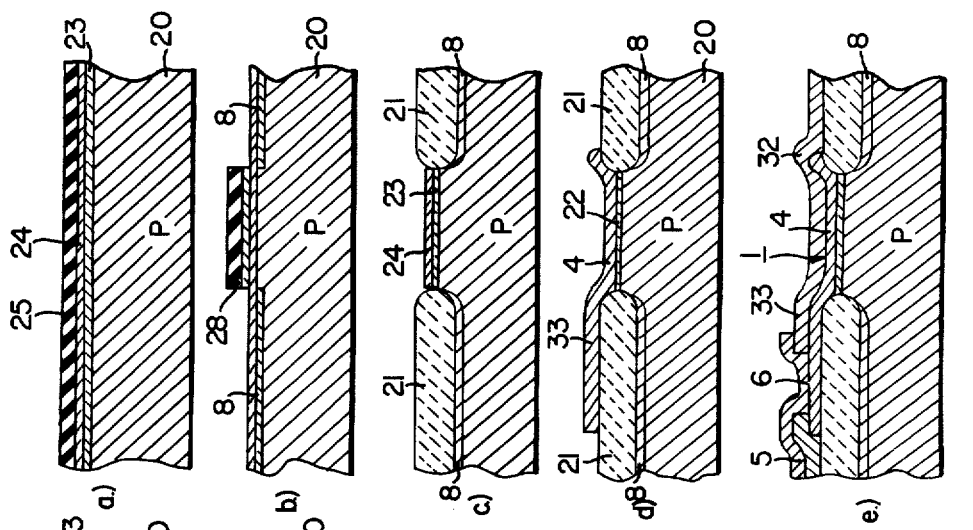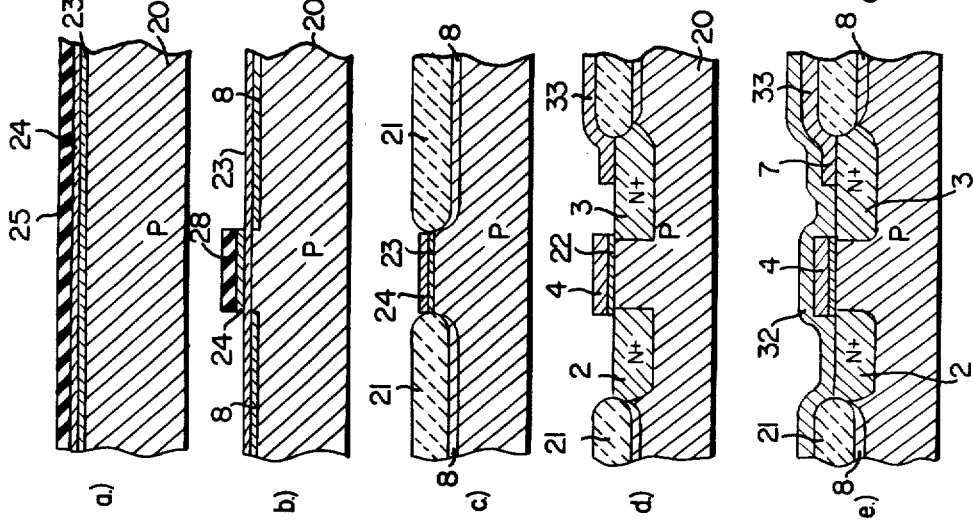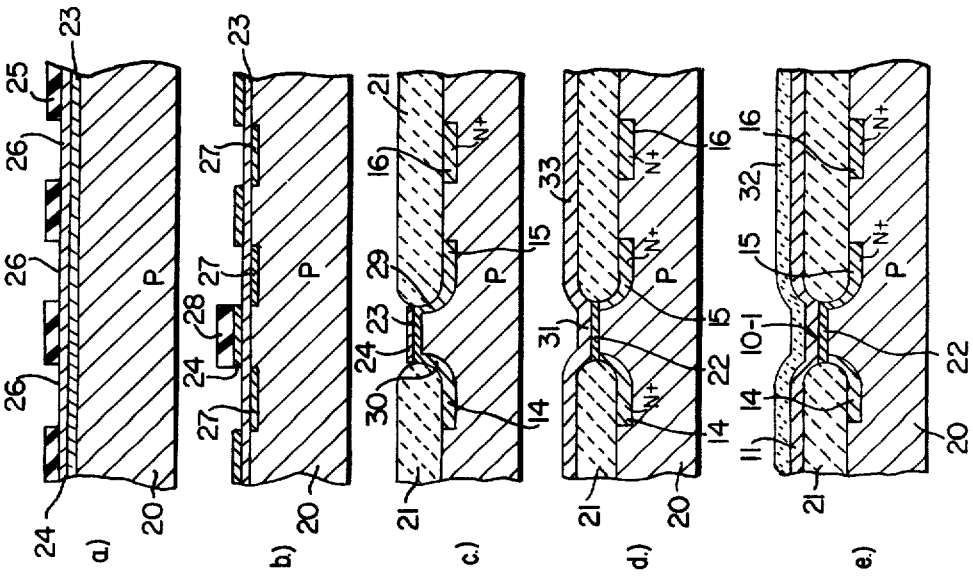

SILICON GATE MOS ROM

RELATED CASES

This application is a continuation-in-part of my copending application Ser. No. 701,932, filed July 1, 1976, now abandoned, assigned to Texas Instruments Incorporated.

BACKGROUND OF THE INVENTION

This invention relates to semiconductor memory devices, and more particularly to an N-channel silicon gate MOS read only memory and a process for making it.

Semiconductor memory devices are widely used in the manufacture of digital equipment, particularly minicomputers and microprocessor systems. Often bulk storage of fixed programs is provided by MOS read only memory devices or "ROMs". The economies of manufacture of these devices, and of mounting them on circuit boards in the system, are such that the number of memory bits per semiconductor chip is advantageously as high as possible. ROMs of 8K and 16K sizes are typical, these referring to 8192 or 16384 bits per chip. This dictates that cell sizes for the storage cells of the ROM be quite small. P-channel ROMs of this size can be relatively easily fabricated in the manner set forth in U.S. Pat. No. 3,541,543, assigned to Texas Instruments. However, most microprocessor and computer parts are now made by the N-channel silicon gate process because of the shorter access times provided. The N-channel process is not favorable to layout of ROM cells of small size. Previous cells have required contact areas between metal or polysilicon lines and the semiconductor material, using excessive space on the chip. Also, metal leads have been used in the array, which introduces unwanted capacitance. Other cells have required processing not compatible with standard manufacturing techniques.

It is the principal object of this invention to provide a semiconductor memory cell of small size which does not require contact areas in the ROM storage cell array. Another object is to provide a small-area N-channel MOS ROM cell which is made by a process compatible with standard manufacturing techniques.

SUMMARY OF THE INVENTION

In accordance with an embodiment of the invention, a metal-oxide-semiconductor read only memory, or MOS ROM, is formed in an integrated circuit along with other silicon gate transistors for the peripheral circuitry. The ROM is an array of potential MOS transistors where polysilicon strips on a silicon chip define the address lines, and output and ground lines are defined by N+ implanted regions buried beneath field oxide. In the array, each potential MOS transistor is a storage cell, with each cell being programmed to store a logic "1" or "0" by providing either a thin oxide gate region beneath a polysilicon address line or a thick field oxide. No metal-to-polysilicon or polysilicon-to-silicon contacts are needed in the cell, and the resulting cell size is quite small.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 4a-4e are elevation views in section of the ROM array part of the semiconductor device of FIGS. 1 and 3a-3d, at successive stages in the manufacturing process, taken along the line a—a in FIG. 1;

FIGS. 5a-5e and 6a-6e are elevation views in section of the typical transistor portion of the semiconductor device of FIG. 1, at successive stages in the manufacturing process, taken along the lines 5—5 and 6—6, respectively in FIG. 1.

DETAILED DESCRIPTION OF SPECIFIC EMBODIMENT

Figure 1:
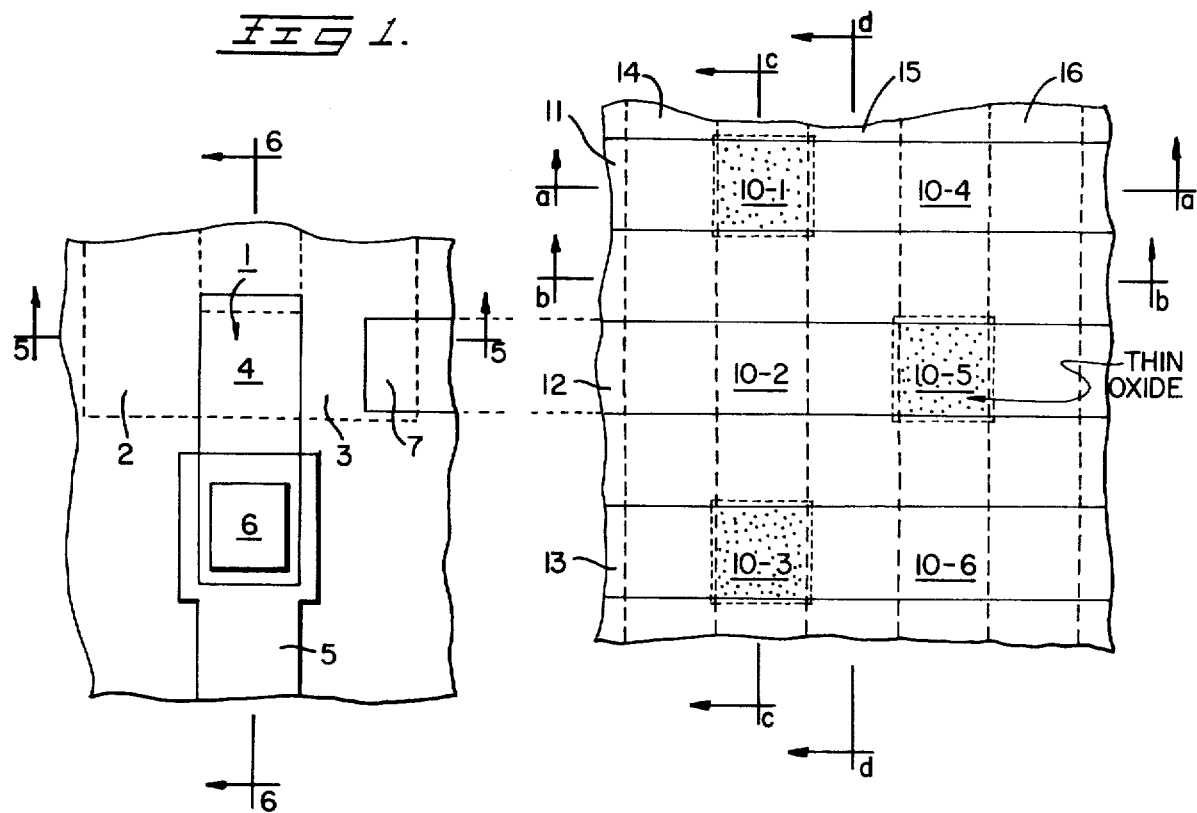
FIG. 1 is a greatly enlarged plan view of a small portion of a semiconductor chip showing the physical layout of a part of a ROM array and a peripheral transistor made according to the invention.
Figure 2:
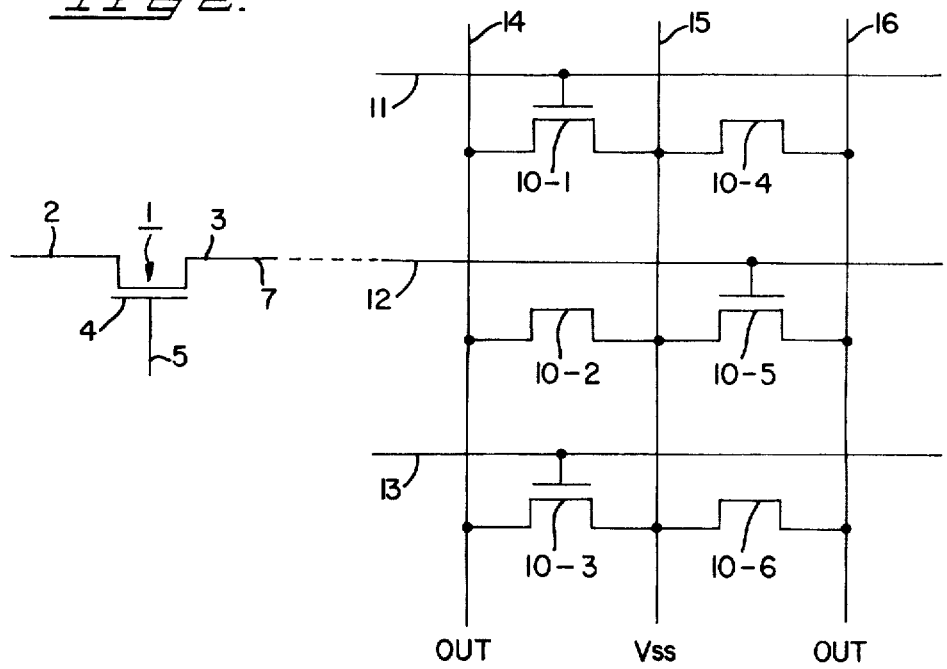
FIG. 2 is an electrical schematic diagram of the ROM of FIG. 1.
Figure 3A:
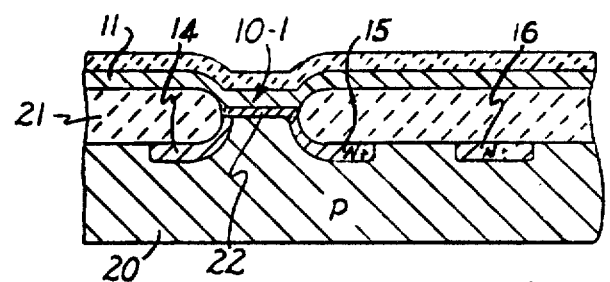
FIGS. 3a-3d are elevation views in section of the cell of FIG. 1, taken along the lines a—a, b—b, c—c, and d—d, respectively.
Figure 3B:
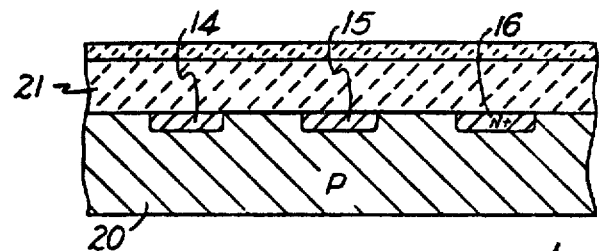
Figure 3C:
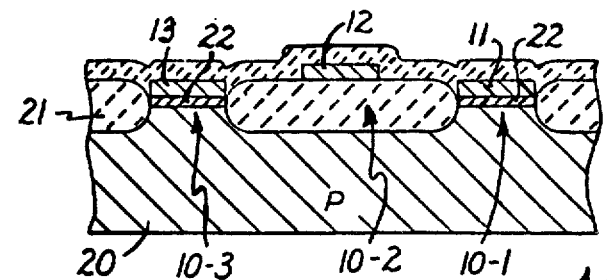
Figure 3D:
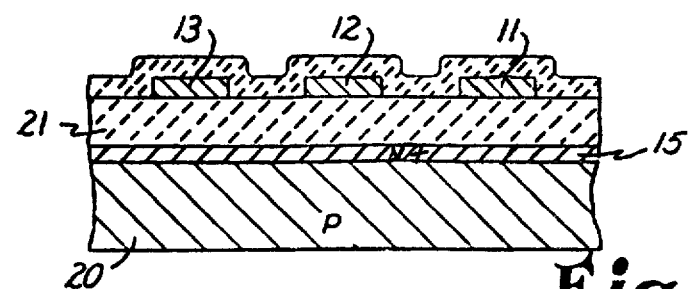

Referring to FIG. 1, a layout of a small part of an integrated circuit chip including an N-channel MOS ROM and a typical transistor 1 is shown. Although only six cells of the ROM are shown, usually the ROM would contain some large power of two, such as 4096, 8192, or 16,384 cells on a chip of perhaps 150 to 200 mils on a side. Each cell is about 0.25 mil sq. The transistor 1 of FIG. 1 would be typical of that used in the decoders, input/output circuits, and clock generators also on the chip. FIG. 2 shows the six ROM cells of FIG. 1, but in electrical schematic form. The ROM consists of cells 10-1 to 10-6 located at the intersections of polysilicon lines 11, 12 and 13 and potential MOS transistor cell areas defined by N+ diffused regions 14, 15, and 16. The line 15 is connected to ground or Vss, while the lines 14 and 16 are output lines. The output lines would be connected to load devices (usually transistors 1) which would hold them at Vdd except when one of the devices 10-1, 10-3 or 10-5 grounded them to Vss line 15. The lines 11, 12 and 13 would be connected to an X address decoder in accord with standard practice, which would select only one of the lines to go to Vdd, or about 5 to 12 volts, for a given address. The others would remain at Vss. In a 16K ROM, for example, there may be 128 lines like line 11, 12 and 13; likewise, these would be 128 "Y" or output lines like 14 and 16, usually grouped to provide a sixteen bit word, as an example. In the segment shown, cells 10-1, 10-3 and 10-5 are programmed as ones, the remainder as zero. The N+ regions are buried beneath field oxide. Note that there are no metal lines in the ROM array, and no contact areas between the poly lines and underlying N+ regions.

The structure of the ROM device of FIGS. 1 and 2 is best understood by reference to FIGS. 3a-3d, which are sectional views showing some of the potential MOS transistors realized as devices and some not. The device is fabricated on a P-type silicon chip 20, and the N+ regions 14, 15 and 16 extend into the surface of the chip, buried beneath a field oxide layer 21, except where a gate of a potential field effect transistor is realized, in which case the N+ regions extend up to the original silicon surface beneath a thin gate oxide layer 22. The polysilicon strips 11, 12 and 13 extend along the chip on top of the field oxide 21, except at the positions 10-1, 10-3 and 10-5 where ones are programmed, and here the polysilicon dips down to the gate oxide level. The cell size of the ROM of FIG. 1 is as low as 0.25 sq. mil per bit, which is about half that of N-channel ROMs made by other techniques.

The MOS transistor 1 of FIG. 1 is of the conventional N-channel silicon-gate type and includes an N+ source region 2, an N+ drain region 3, and a gate 4 which is composed of the same polysilicon which forms the strips 11, 12 and 13. A metal strip 5 is connected to the gate at a metal-to-poly contact area 6. A poly-to-silicon contact 7 makes connection to the drain 3.

Referring now to FIGS. 4a–4e, 5a–5e and 6a–6e, a process for making the N-channel, silicon-gate MOS integrated circuit device of FIGS. 1 and 3a–3d will be described. The starting material is a slice of P-type monocrystalline silicon, perhaps 3 inches in diameter and 20 to 40 mils thick, cut on the <100> plane, of a resistivity of about 6 to 8 or 12 to 15 ohm-cm. In the FIGURES the chip or bar 20 represents a very small part of the slice, perhaps 1 or 2 mils wide for each part. After appropriate cleaning, the slice is oxidized by exposing to oxygen in a furnace at an elevated temperature of perhaps 1100° C. to produce an oxide layer 23 of a thickness of about 800 to 1000 Å. Parts of this layer may stay in place to become the gate insulator areas 22. Next, a layer 24 of silicon nitride of about 1000 Å thickness is formed by exposing to an atmosphere of silane and ammonia in an rf plasma reactor. A coating 25 of photoresist is applied to the entire top surface of the slice, then exposed to ultraviolet light through a mask which defines the desired pattern of N+ regions 14, 15 and 16, and developed. This leaves areas 26 where nitride is to be etched away by a nitride etchant which removes the exposed part of the nitride layer 24 but does not remove the oxide layer 23 and does not react with the photoresist 25.

The slice is now subjected to an ion implant step, whereby phosphorus atoms are introduced into regions 27 (seen in FIG. 4b) of silicon not masked by photoresist 25, nitride 24 and/or oxide 23. The photoresist is preferably left in place as it also masks the implant; the oxide layer 23 is left in place during the implant because it prevents the implanted phosphorus atoms from out-diffusing from the surface during subsequent heat treatment. This implant is at a dosage of about $4 \times 10^{15}$ to $1 \times 10^{16}/cm^2$ at 150 KeV.

As will be seen, the regions 27 do not exist in the same form in the finished device, because some of this part of the slice will have been consumed in the field oxidation procedure.

Next, the photoresist coating 25 is removed and another photoresist coating 28 is applied over the entire slice, then exposed to UV light through a mask which exposes only the gate areas of what are to become the realized MOS transistors 10-1, 10-3 and 10-5. That is, this step defines the ROM code. Also, the moat area for the transistor 1 and other moat areas in the peripheral circuitry is exposed so the photoresist 28 will stay in place. Upon developing, unexposed photoresist is removed from most of the surface of the slice as seen in FIGS. 4b, 5b and 6b. The region where the gate of transistor 10-1 will be created is covered, as well as the moats for the transistor 1 and other parts of the circuit. The nitride layer 24 is etched away in the exposed areas, and the oxide 23 is left in place.

A field-stop implant is now performed which comprises a sequence as described in my application Ser. No. 691,252, filed May 28, 1976, or Ser. No. 648,593, filed Jan. 12, 1976, and an anneal step is likewise performed. This produces P+ regions 8 as seen in FIGS. 5b and 6b. The implant is masked by a photoresist coating which covers everything except the moats; the resist 28 can be left in place, or alternatively one photoresist operation can be used for the ROM code, then another for the moats before the field stop implant.

The next step in the process is formation of field oxide 21, which is done by subjecting the slices to steam or an oxidizing atmosphere at about 900° C. for perhaps 10 hours. This causes a thick field oxide region or layer 21 to be grown as seen in FIGS. 4c, 5c or 6c and this region extends into the silicon surface because silicon is consumed as it oxidizes. The remaining parts of the nitride layer 24 mask oxidation. The thickness of this layer 21 is about 10,000 to 12,000 Å, about half of which is above the original surface and half below. The phosphorus doped N+ regions 27 formed by implant will be partly consumed, but will also diffuse further into the silicon ahead of the oxidation front. Thus, N+ regions 14, 15 and 16 will result which will be much deeper than the original regions 27. Lateral diffusion beneath the edges of the protected gate oxide 22 will cause the regions 14 and 15 to provide the source and drain regions 29 and 30 of the MOS transistor 10-1. The P+ field-stop implant regions 8 also diffuse further into the silicon as the surface is consumed.

The nitride layer 24 is removed by etching, and its underlying oxide layer 23 is left in place to become the gate insulators 22 of the transistors. Alternatively the oxide 23 may be removed by etching and a new layer 22 grown for the gate insulators. In areas of the slice where depletion load devices are required, although not pertinent to this invention, a masked ion implant step would be done at this point. Also, windows for polysilicon to silicon contact 7 and other such contacts are patterned and etched at this point using photoresist; none are needed in the ROM array itself, only in the peripheral circuitry such as the transistor 1. A layer 33 of polycrystalline silicon is deposited over the entire slice in a reactor using standard techniques (usually this layer is doped with phosphorus by the later N+ diffusion to make it highly conductive). The polysilicon layer 33 is next patterned by applying a layer of photoresist, exposing to ultraviolet light through a mask prepared for this purpose, developing, then etching (of both photoresist and exposed oxide 22), with the remaining photoresist masking certain areas of the polysilicon to define the lines 11, 12 and 13 as well as the gate 4 and the connection to the contact 7 and other such parts of the circuit on the chip. The resulting structure is seen in FIG. 4d, where a part of the remaining polysilicon layer provides what will be the gate 31 of MOS transistor 10-1, and thin oxide 22 underneath it is the gate oxide of the transistor. These polysilicon and oxide layers also provide gate and gate oxide for all the other realized transistors in the ROM array, and gate and gate oxide for peripheral transistor 1 and all others on the slice.

The slice is now subjected to a standard N+ phosphorus diffusion which creates the source and drain regins 2 and 3 as well as all other N+ regions for transistors and interconnects (except in the ROM array) throughout the chip. The N+ diffusion is masked by the field oxide 21 and the gate oxide 22.

As seen in FIGS. 4d, 5d and 6d, fabrication of the device is continued by depositing another layer 32 of phosphorus-doped oxide. Rather than by oxidizing, this is done by a low temperature reaction process using conventional chemical vapor deposition techniques. The layer 32 is of about 6,000 Å thickness, covering the entire slice. Subsequently, windows are opened in the oxide layer 32 in areas where contact is to be made to regions of the silicon or to the polysilicon layer using photoresist masking and etching; for example, the contact area 6 is opened at this point. Then, a layer of aluminum is deposited on the entire slice, for use as interconnections in peripheral circuitry but not in the ROM array, and patterned using photoresist masking to provide the desired metal interconnections such as the connection 5. Ultimately, the slice is scribed and broken into individual chips, each perhaps 150 to 200 mils on a side, and the chips are mounted in suitable packages.

It is important to note that the ROM array made by the process described is self-aligned in that the nitride mask 24 which defines the edges of the implanted region 27 (later to be the elongated N+ regions 14, 15, 16) also defines the edges of the field oxide 21 and the field oxide keeps the polysilicon strips 11, 12 and 13 spaced a substantial distance above the edges 29 and 30 which form the source and drain regions (see FIGS. 4c and 4d). Although shown distorted in dimension, the overlap of the regions 29 and 30 beneath the gate is actually quite small, much less than the overlap needed in a process which is not self-aligning. Indeed, this overlap 29 and 30 is less than the diffusion of the edges of the source 2 and drain 3 beneath the gate 4 in FIG. 5d. Certainly it is an order of magnitude less than if a mask defining the gate area had to be aligned with a prior diffusion or implant, as in the conventional P-channel ROM process. This reduction in overlap provides a minimum of capacitance from the address lines 11, 12, 13 to the bit lines 14, 15, 16. Also, the capacitance is less than when metal is used as in P-channel ROM's.

While this invention has been described with reference to an illustrative embodiment, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. An N-channel silicon gate metal-oxide-semiconductor read only memory comprising a P-type monocrystalline silicon chip, a thick thermal field oxide coating on most of a face of the chip surrounding moat areas and extending into the face of the chip, a plurality of elongated N+ silicon regions extending along the face beneath the field oxide, a plurality of address lines in the form of polysilicon strips extending along the face overlying the thick field oxide generally perpendicular to the elongated regions and extending across the elongated regions, potential MOS transistors existing at a plurality of areas between elongated regions beneath the polysilicon strips, thin gate oxide being located over the moat areas at some of the plurality of areas and thick field oxide being located at other of the plurality of areas, the field oxide being many times thicker than the gate oxide, the parts of the face of the chip at the areas beneath the gate oxide being moat areas in a plane substantially above that of the lower extremity of the field oxide, the level of the gate oxide being below that of the polysilicon strips and above that of the N+ regions, the N+ silicon regions extending up to the gate oxide at said moat areas to provide the source and drain regions of the MOS transistors, some of the elongated N+ silicon regions providing ground lines and some providing output lines, and a peripheral transistor included in said face of the chip at a position spaced from said MOS transistors, the peripheral transistor having a gate formed by a part of one of the polysilicon strips and having heavily-doped source and drain regions self-aligned with said part, the source and drain regions being in a moat area in said plane.

2. A read only memory according to claim 1 wherein the field oxide is about ten times as thick as the gate oxide.

3. A semiconductor device comprising a silicon semiconductor body, a coating of relatively thick thermal oxide over most of a face of the body, a plurality of elongated heavily-doped semiconductor regions extending along the face beneath the coating of thick oxide, a plurality of conductive strips of doped polycrystalline silicon extending along the face overlying the coating of thick oxide generally perpendicular to and extending across the elongated regions, potential N-channel silicon-gate MOS transistor devices being provided at a plurality of areas between elongated regions beneath the conductive strips, relatively thin oxide being located at some of said plurality of areas and said relatively thick oxide being located at other of said plurality of areas, the thick oxide being many times thicker than the thin oxide, the thin oxide being in a plane below that of the conductive strips and above that of the upper surface of the elongated regions, and a peripheral transistor at said face located away from said MOS transistors having a gate created by the doped polycrystalline silicon and having source and drain regions self-aligned with said gate, a gate oxide in said plane beneath the gate of the peripheral transistor.

4. A device according to claim 3 wherein the relatively thick oxide coating is about ten times thicker than the relatively thin oxide coating.

5. A device according to claim 4 wherein some of the elongated regions provide ground lines and some provide output lines.

6. A method of making a semiconductor read-only memory device comprising the steps of: selectively introducing a conductivity type determining impurity into a face of a monocrystalline silicon semiconductor wafer to produce a plurality of parallel N+ elongated regions; masking a plurality of areas of said face between the elongated regions with a material which inhibits oxidation; thermally growing thick field oxide on said face while driving said impurity further into the face to provide buried heavily-doped N+ elongated regions; removing the masking material; forming a thin thermal oxide layer in the plurality of areas; and providing a plurality of strips of polycrystalline silicon conductive material over the field oxide generally perpendicular to the elongated regions extending across the thin oxide layer in the plurality of areas to provide the gates of N-channel silicon-gate MOS transistors, parts of the N+ elongated regions providing the sources and drains of the transistors, the transistors existing at some selected intersections of strips of conductive material and elongated regions but not all intersections, the thin oxide layer being in a plane below that of said strips and above that of the lower edge of the thick field oxide; and wherein a peripheral transistor is formed in said face of the wafer at a position spaced from said MOS transistors with said conductive material forming its gate, the source and drain of the peripheral transistor being created by a diffusion occuring after the conductive material is in place and being masked by thin oxide under the conductive material to provide a self-aligned structure.

7. A method according to claim 6 wherein the impurity is introduced by ion implant.

* * * * *